United States Patent [19]
Gerber et al.

[11] Patent Number: 6,114,875
[45] Date of Patent: Sep. 5, 2000

[54] CIRCUIT FOR CONVERTING ANALOGUE LEVELS

[75] Inventors: Remi Gerber; Janick Silloray, both of Nantes, France

[73] Assignee: MHS, Nantes, France

[21] Appl. No.: 09/041,862

[22] Filed: Mar. 12, 1998

[30] Foreign Application Priority Data

Mar. 14, 1997 [FR] France ................................. 97 03110

[51] Int. Cl.$^7$ .............................................. H03K 19/0175
[52] U.S. Cl. ................................. 326/80; 326/81; 326/68
[58] Field of Search ................................ 326/80, 81, 65, 326/68, 70, 76

[56] References Cited

U.S. PATENT DOCUMENTS 5,463,330  10/1995  Tsuchida ..................................... 326/81
5,537,059  7/1996  Asahina ..................................... 326/81

Primary Examiner—Michael Tokar
Assistant Examiner—Daniel D. Chang
Attorney, Agent, or Firm—Christensen O'Connor Johnson & Kindness PLLC

[57] ABSTRACT

A high/low and low/high analogue level converter circuit for integrated circuits in which a high/low converter circuit comprises, supplied at a first voltage value, a converter module which receives a logic input signal of analogue level adapted to this first voltage value and delivers a logic signal inverted and replicated with analogue level adapted to this first voltage value, and, supplied at a second voltage value, a differential converter module which from inverted and replicated logic signals delivers a converted logic input signal with analogue level adapted to second voltage value. The low/high converter circuit comprises, supplied at a given first voltage value, an inverter stage which receives a logic input signal with analogue level adapted to the given first voltage value and delivers an inverted input signal, and, supplied at a second given voltage value, an amplifier converter module which, from inverted input signal, delivers a converted logic input signal with analogue level adapted to the given second voltage value.

7 Claims, 6 Drawing Sheets

CIRCUIT FOR CONVERTING ANALOGUE LEVELS

FIELD OF THE INVENTION

The invention relates to a circuit for converting analogue levels which can be used for the conversion of logic signals providing for the transmission of information between various parts of integrated circuits.

BACKGROUND OF THE INVENTION

At the present time, the implementation of integrated circuits involves the design, drafting and integration of circuits of greater and greater complexity by virtue of the novel successive functions fulfilled by them.

While one of the major objectives, up to recent times, in respect of the implementation of such circuits, has consisted, at the cost of very substantial research and development effort, in steadily enhancing the possibilities for integration, by successively employing technologies for etching from micron fineness to submicron fineness, in order to cater for the appearance of the aforementioned novel functions by increasing the density of integration, it has also appeared to be necessary, by virtue in particular of the variety and diversity of the basic circuits required to carry out these functions, to provide a specific electrical supply, via functional areas, for these basic circuits or groups of basic circuits. This is because the physical phenomena brought into play by these basic circuits or groups of basic circuits are sufficiently different as to justify a specific electrical supply thereto, so as to allow, in particular, optimum functioning thereof as a function of their supply voltage.

Thus, by way of non-limiting example, in the case of a random access memory area, RAM memory, such memory areas usually comprise, in current integrated circuits, as represented in FIG. $1_0$, a central area or core C, formed by memory cells in which digital data can be stored, and a peripheral area P, formed by buffer circuits, allowing write/read access of the aforementioned memory cells.

When the technology used to produce such memory circuits is for example CMOS technology, it is advantageous to maintain the supply voltage to the memory cells at a relatively high value, so as to benefit from the higher switching speed, and hence from the greater read/write speed, of the aforementioned memory areas.

However, supplying the peripheral area, formed by the buffer circuits, at as high a voltage, is not justified This is because, on the one hand, maintaining a high supply voltage to the aforementioned buffer area is liable to cause a non-negligible level of noise to be maintained on the input/output signals, that is to say the signals for writing/reading the memory cells, transmitted by the aforementioned buffer area.

On the other hand, maintaining a relatively high supply voltage to the buffer area maintains a substantial level of electrical consumption while, with regard to these buffer circuits, the switching speed is not vital, on account of the buffer function of these circuits, this manifestly impeding the actual endurance of sophisticated functional elements such as portable microcomputers supplied from a storage battery.

Finally, within the context of current or foreseeable development work aimed at reducing the amplitude of switching of logic signals from a high analogue level to a low analogue level, it would appear opportune to be able to utilize devices for converting analogue levels from a standard customarily used value to a smaller less commonly used value or vice versa, so as to provide for progressive adaptation of newly developed integrated circuits or parts of integrated circuits, supplied with these less common values of supply voltage, to conventional integrated circuits supplied with these standard supply values.

OBJECTS OF THE INVENTION

The object of the present invention is the implementation of such circuits for converting analogue levels of logic signals exchanged between various parts of integrated circuits.

Another object of the present invention is accordingly the implementation of a circuit for converting analogue levels of logic signals exchanged between a first functional area of an integrated circuit, this area being supplied from an electrical supply at a first voltage value, into second logic signals of a second functional area of this integrated circuit, this area being supplied from an electrical supply at a second voltage value, less than the first.

Another object of the present invention is accordingly the implementation of a circuit for converting analogue levels of logic signals exchanged between a first functional area of an integrated circuit, this area being supplied from an electrical supply at a first voltage value, into second logic signals of a second functional area of this integrated circuit, this area being supplied from an electrical supply at a second voltage value, greater than the first.

Another object of the present invention is also, in an integrated circuit of random access memory type comprising a first functional area, consisting of a set of memory cells, and a second functional area, consisting of buffer circuits, the first functional area being supplied with a first voltage value and the second functional area being supplied with a second voltage value, less than the first, the first functional area delivering to the second functional area, logic input signals and logic control signals of analogue level adapted to the first voltage value and the second functional area delivering to the first functional area, logic output signals at an analogue level adapted to the second voltage value, a converter of analogue levels of these logic input signals, logic control signals and logic output signals.

Another object of the present invention is also, in an integrated circuit of random access memory type comprising a first functional area, consisting of a set of memory cells, and a second functional area, consisting of buffer circuits, the first functional area being supplied with a first voltage value and the second functional area being supplied with a second voltage value, greater than the first, the first functional area delivering to the second functional area, logic input signals and logic control signals of analogue level adapted to the first voltage value and the second functional area delivering to the first functional area, logic output signals at an analogue level adapted to the second voltage value, a converter of analogue levels of these logic input signals, logic control signals and logic output signals.

Another object of the present invention is, finally, in an integrated circuit of random access memory type containing a first functional area, consisting of buffer circuits, and of a second functional area, formed by memory cells, the first and the second functional area being supplied from an electrical supply which can be switched between a first and a second voltage value, the second voltage value being less than, equal to or greater than the first, the first functional area delivering to the second functional area, logic input signals and logic control signals at a logic level adapted to the first, respectively second voltage value, and the second functional area delivering to the first functional area, logic output signals at an analogue level adapted to the first, respectively second voltage value, a configurable converter for converting analogue levels of these logic input signals, logic control signals and logic output signals between the analogue levels of the first and of the second voltage value, making possible, either the high analogue level/low analogue level conversion, and vice versa, between the first and a second functional area, or a low analogue level/high analogue level conversion, and vice versa, between first and second functional area, or else a conversion between the same high, respectively low analogue level, as a function of the relative value of the first and of the second voltage value.

SUMMARY OF THE INVENTION

The circuit for converting analogue levels of first logic signals of a first functional area of an integrated circuit, this area being supplied from an electrical supply at a first voltage value, into second logic signals of a second functional area of this integrated circuit, this area being supplied from an electrical supply at a second voltage value, less than the first voltage value, these voltage values being defined with respect to the same reference voltage, in accordance with the subject of the present invention, is noteworthy in that it comprises, connected in succession in cascade with respect to the same common reference voltage, a first converter module, supplied at the first voltage value, which receives on an input terminal a logic input signal consisting of the first logic signals and whose analogue level is equal to that of the first voltage value and which delivers a replicated logic input signal and an inverted logic input signal, whose analogue level is adapted to that of the first voltage value. Furthermore, a second differential converter module, supplied at the second voltage value, which receives the said replicated logic input signal and the said inverted logic input signal and delivers a converted input signal in phase with the logic input signal and whose analogue level is adapted to that of the second voltage value, this converted input signal constituting the second logic signals.

The circuit for converting analogue levels of first logic signals of a first functional area of an integrated circuit, this area being supplied from an electrical supply at a first voltage value, into second logic signals of a second functional area of this integrated circuit, this area being supplied from an electrical supply at a second voltage value, greater than the first voltage value, these voltage values being defined with respect to the same reference voltage, in accordance with the subject of the present invention, is noteworthy in that it comprises, connected in cascade, with respect to this common reference voltage, an inverter stage supplied at the first voltage value, receiving on an input terminal an input logic signal consisting of the said first logic signals, whose analogue level is adapted to that of the first voltage value and delivering an inverted logic input signal. Furthermore, an amplifier converter module is provided, supplied at the second voltage value, which receives this inverted logic signal on an input terminal and delivers via amplification, a converted input signal in phase with the logic input signal and whose analogue level is adapted to that of the second voltage value, constituting the said second logic signals.

The circuit for converting analogue levels of logic signals from a first to a second voltage value, in accordance with the subject of the present invention, both in its version with second voltage value less than as well as greater than the first voltage value, finds application in the production of high level/low level and low level/high level converter circuits for analogue levels, in particular of configurable converters for integrated circuits.

BRIEF DESCRIPTION OF THE DRAWINGS

It will be better understood on reading the description and looking at the drawings below, in which:

FIG. 1$a$ represents a high level/low level converter circuit for analogue levels of logic signals, in accordance with the subject of the present invention, the second voltage value being less than the first voltage supply value;

FIG. 1$b$ represents a low level/high level converter circuit for analogue levels of logic signals, in accordance with the subject of the present invention, the second voltage value being greater than the first voltage supply value;

FIG. 2$b$ represents a timing diagram for the signals charted at noteworthy test points of FIG. 1$b$;

FIG. 3$b$ represents a converter of analogue levels of logic signals, input signals, control signals and output signals exchanged between the central part of a random access memory supplied at a first voltage value and the peripheral part for access to this central part, supplied at a second voltage value, greater than the first voltage value;

DESCRIPTION OF THE PREFERRED EMBODIMENTS

A more detailed description of a circuit for converting analogue levels, in accordance with the subject of the present invention, will now be given in conjunction with FIGS. 1$a$ and 1$b$ in the case of the high level/low level conversion of analogue levels, in the case of FIG. 1$a$, and low level/high level conversion in the case of FIG. 1$b$.

Figure 1O:
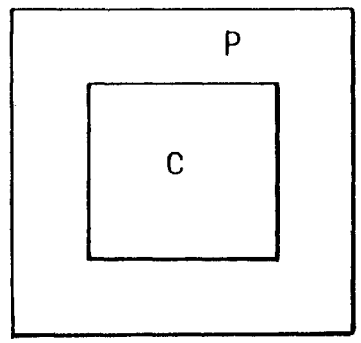
FIG. 1$o$ (prior art) represents a random access memory area in known integrated circuits.

It will be understood in particular that by virtue of the nonsymmetric switching phenomena involved in the high level/low level, respectively low level/high level type conversion, the embodiments represented in FIGS. 1$a$ and 1$b$ of the circuits for converting two analogue levels, in accordance with the subject of the present invention, are in fact complementary, so as to ensure the greatest flexibility of implementation and of functioning within the framework of applications to integrated circuits supplied at one or more voltages with different supply values.

In the figure relating to the prior art, FIG. 1$_0$, is represented the overall installation diagram for a random access memory, generally implemented in current integrated circuits.

As represented in the figure relating to the aforementioned prior art, this random access memory in fact comprises the central area, denoted C, comprising a plurality of read/write addressable memory cells and a peripheral area, denoted P, consisting of buffer circuits and allowing write/read access to the memory cells of the aforementioned central area C.

In the whole of the description which follows and by purely non-limiting convention, it is indicated that the central area C constitutes, in respect of the aforementioned integrated circuit, a first functional area supplied from an electrical supply at a first voltage value, while the peripheral area P constitutes in respect of this integrated circuit a second functional area supplied from an electrical supply at a second voltage value. Of course, the first and the second voltage value are defined with respect to the same reference voltage, the earth voltage of the integrated circuit for example.

In view of the above indications given in conjunction with FIG. $1_0$ relating to the prior art, it is indicated that the circuit for converting analogue levels of logic signals, which is the subject of the present invention, in fact makes it possible to effect a conversion of first logic signals adapted to the first functional area, into second logic signals adapted to the second functional area so as ultimately to ensure the functioning of one and the other functional area, bearing in mind the supply value to the first and to the second aforementioned functional area, each supply value possibly being for example distinct, as mentioned previously in the description.

By logic signals adapted to the first, respectively to the second functional area as a function of the supply voltage thereto, it is indicated that, by convention, and without in any way impairing the generality of the description below, each logic signal adapted to the corresponding functional area exhibits for example a low logic level equal to the reference voltage and a high logic level whose analogue value is equal to or less than that of the corresponding supply voltage.

Figure 1A:
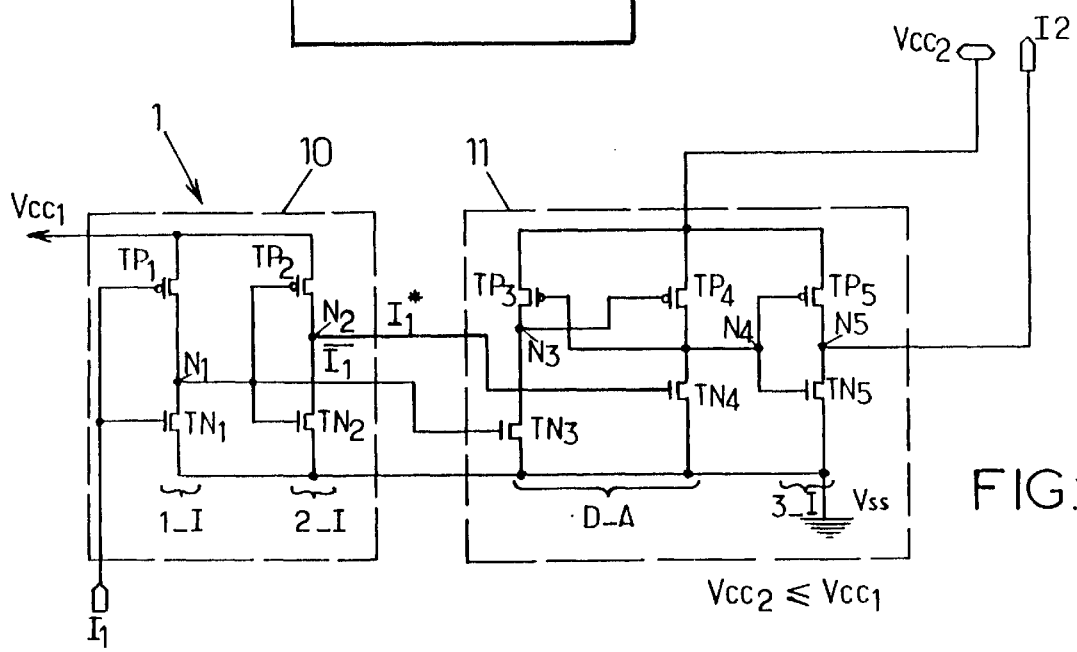

The circuit for converting analogue levels of first logic signals of a first functional area of an integrated circuit, the central area C for example, supplied from an electrical supply at a first voltage value, which may be taken equal to 5 V to fix matters, into second logic signals of a second functional area, the peripheral area P of this integrated circuit represented in the figure relating to the prior art, this area being supplied from an electrical supply at a second voltage value taken, to fix matters, at the value 3 V, less than the first voltage value, will now be described in conjunction with FIG. 1a.

With reference to the aforementioned figure, it is indicated that the first voltage value is denoted $VCC_1$ and that the second voltage value is denoted $VCC_2$ with $VCC_2$ less than or equal to $VCC_1$, these voltage values of course being referenced with respect to the common reference voltage, the earth voltage of the integrated circuit.

According to the aforementioned figure, the high level/low level converter circuit 1 for analogue signals, which is the subject of the present invention, comprises, connected in cascade with respect to the aforementioned common reference voltage, a first converter module 10 supplied at the first voltage value $VCC_1$, this first converter module 10 receiving a logic input signal, referenced $I_1$, on an input terminal, this logic input signal of course consisting of the first logic signals and its analogue level being adapted to that of the aforementioned first voltage value $VCC_1$. The first converter module 10 delivers a replicated logic input signal, denoted $I^*_1$, and an inverted logic input signal, denoted $\bar{I}_1$. The analogue level of the replicated input signal $I^*_1$ and of the inverted logic input signal $\bar{I}_1$ is of course adapted to that of the first voltage value $VCC_1$ as mentioned previously in the description.

Furthermore, the analogue level converter circuit 1 as represented in FIG. 1a comprises, supplied at the second voltage value $VCC_2$, a second differential converter module denoted 11 which receives the replicated logic input signal $I^*_1$ and the inverted logic input signal $\bar{I}_1$, the differential converter module 11 delivering a converted logic input signal denoted $I_2$ in phase with the logic input signal $I_1$ and whose analogue level is of course adapted to that of the second voltage value $VCC_2$. This converted logic input signal in fact constitutes the second logic signals transmitted, after conversion, to the second functional area such as described previously in the description.

In more detail, as represented in the aforementioned FIG. 1a, it is indicated that the first converter module 10 can advantageously comprise a first inverter stage denoted 1-I which receives the logic input signal on an input terminal, that is to say the previously mentioned signal $I_1$ and delivers the aforementioned inverted logic input signal denoted If.

In general, it is indicated that the first inverter stage 1-I can advantageously comprise a PMOS type transistor referenced $TP_1$ connected in series with an NMOS type transistor denoted $TN_1$. As represented in the aforementioned FIG. 1a, the drain electrode of the transistor $TP_1$ is linked directly to the first supply voltage $VCC_1$, the source electrode of the transistor $TP_1$ is connected to the source electrode of the transistor $TN_1$ at a point or node N1 and the drain electrode of the transistor $TN_1$ is connected to the reference voltage VSS. The gate electrodes of the transistors $TP_1$ and $TN_1$ are connected in parallel so as to receive the aforementioned logic input signal $I_1$ on the input terminal of the first converter module 10.

The first converter module 10 also comprises a second inverter stage denoted 2-I, which is interconnected with the first inverter stage 1-I, that is to say with the aforementioned node $N_1$ and receives the inverted logic input signal If and delivers the replicated logic input signal $I_1$.

As represented in more detail in FIG. 1a, the second inverter stage 2-I can be formed by a PMOS transistor denoted $TP_2$ whose drain electrode is connected to the first supply voltage $VCC_1$, the transistor $TP_2$ being connected in series with an NMOS transistor $TN_1$, the source electrode of the transistor $TP_2$ being connected to the source electrode of the transistor $TN_2$ and the drain electrode of the transistor $TN_2$ being connected to the reference voltage. The gate electrodes of the transistors $TP_2$ and $TN_1$ are connected in parallel to the node $N_1$ previously mentioned in the description. The replicated logic input signal is delivered at the node $N_2$ interconnecting the source electrodes of the transistors $TP_2$ and $TN_2$.

In the same way, in FIG. 1a, an embodiment for implementing the second differential converter module 11 is represented in more detail.

The second differential converter module 11 can comprise, advantageously, a differential amplifier stage denoted D-A which receives the inverted logic input signal $\bar{I}_1$ on a first differential input and the replicated logic input signal $I^*_1$ on a second differential input. The differential amplifier stage D-A delivers an amplified difference logic signal. As represented in the aforementioned FIG. 1a, the differential amplifier stage D-A can be formed by a PMOS transistor $TP_3$ and an NMOS transistor $TN_3$ connected in series, the source electrode of the transistor $TP_3$ and of the transistor $TN_3$ being connected at a common node $N_3$ and the two aforementioned transistors connected in series being interconnected between the second supply voltage $VCC_2$ and the reference voltage VSS.

Furthermore, the aforementioned differential amplifier stage D-A also comprises a PMOS type transistor $TP_4$ connected in series with an NMOS type transistor $TN_4$, the source electrode of the transistors $TP_4$ and $TN_4$ being linked together by way of a common node $N_4$, the transistors $TP_4$ and $TN_4$ connected in series being interconnected between the second supply voltage $VCC_2$ and the reference voltage VSS. Furthermore, it is indicated that the node $N_3$, the common point of the transistors $TP_3$ and $TN_3$, is linked to the gate electrode of the transistor $TP_4$ and that the node $N_4$, the common point of the transistors $TP_4$ and $TN_4$, is linked to the gate electrode of the transistor $TP_3$. The gate electrodes of the transistor $TN_3$ and of the transistor $TN_4$ are each interconnected to an input terminal of the second differential converter module 11 and receive the inverted logic input signal $\bar{I}_1$ and the replicated logic input signal $I*_1$ respectively. The node $N_4$ delivers the abovementioned amplified logic difference signal.

Furthermore, the second differential converter module 11 also comprises a third inverter stage denoted 3-I which receives the amplified difference logic signal delivered at the node $N_4$ and delivers the converted logic input signal, that is to say the signal 12 previously mentioned. The third inverter stage 3-I can consist of a PMOS type transistor $TP_5$ connected in series with an NMOS type transistor $TN_5$, the drain electrode of the transistor TP, being linked to the second supply voltage $VCC_2$, the source electrodes of the transistors TP, and TN, being linked at a common point which delivers the converted logic input signal, that is to say the aforementioned signal $I_2$, and the drain electrode of the transistor $TN_5$ being linked to the reference voltage VSS.

The high level/low level converter circuit 1 for logic levels, represented in FIG. 1a, operates as follows.

When the logic input signal $I_1$ goes from VSS=0 V to $VCC_1$=5 V, the voltage at the node $N_1$ goes to the voltage VSS=0 V and the voltage at the node $N_2$ toggles to the voltage $VCC_2$=5 V. Subsequent to this toggling, the voltage at the node $N_4$, while the transistor $TN_4$ is turned on, toggles to the voltage VSS=0 V. The transistor $TN_5$, controlled by the node $N_4$, goes to the off state. The converted logic signal $I_2$, delivered at the node $N_5$, the output of the inverter 3-I, goes to the voltage value $VCC_2$=3 V.

When the logic input signal $I_1$ goes from $VCC_1$=5 V to VSS=0 V, the voltage at the node $N_1$ goes to the value $VCC_1$=5 V and the voltage at the node $N_2$ goes to VSS=0 V. The voltage at the node $N_1$ puts the transistor $TN_3$ into the on state and the voltage at the node $N_3$ toggles to the value VSS=0 V. The transistor $TN_4$ goes to the off state while the voltage at the node $N_3$ equal to VSS=0 V, puts the transistor $TP_4$ into the on state, the voltage at the node $N_4$ toggling to the value $VCC_2$=3 V. The converted logic signal $I_2$, delivered at the node $N_1$, of the inverter 3-I goes to the voltage value VSS=0 V.

Figure 2A:
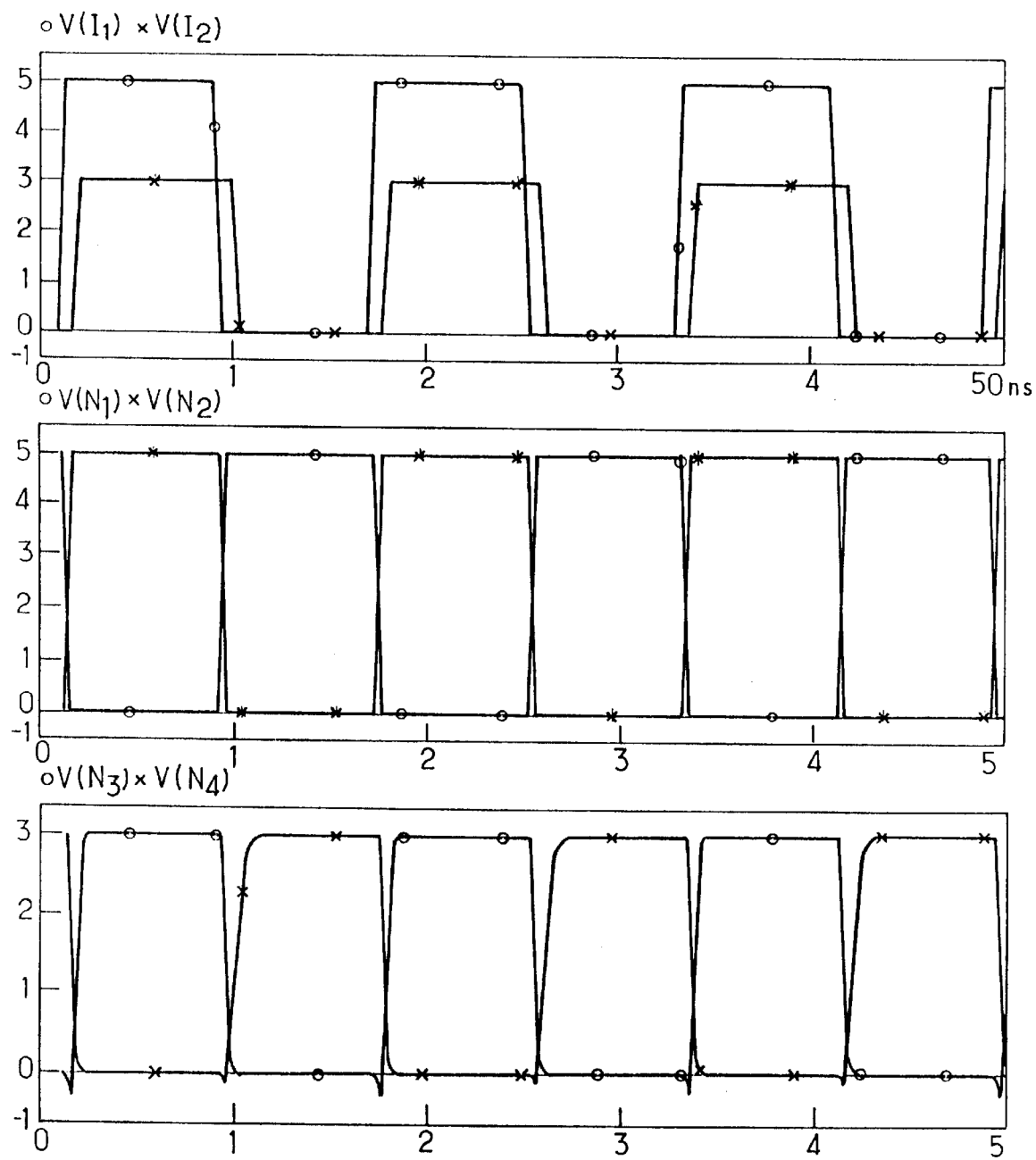
FIG. 2$a$ represents a timing diagram for the signals charted at noteworthy test points of FIG. 1$a$.

A timing diagram of the signals obtained at the test points $N_1$, $N_2$, $N_3$ and $N_4$ of FIG. 1a when, of course, in the embodiment considered in which $VCC_2$=5 V and $VCC_1$=3 V, is represented in FIG. 2a for logic input signals consisting of the signal $I_1$ whose analogue value is adapted to the first voltage value, the peak value of the input signal $I_1$ being for example equal to 5 V.

The converted input signal, the signal $I_2$ is on the contrary adapted to the second voltage value, that is to say equal to the value 3 V, the peak value of the logic signal $I_1$, being equal to this value. It should be observed that the conversion makes it possible to generate a converted logic signal $I_2$ which constitutes the second logic signals, and which is in phase with the input signal, to within the value of the switching times, these introducing a delay at most equal to 50 ns. An intermediate graduation of the abscissa axis in FIG. 2a corresponds to 10 ns.

Of course, the values of the analogue levels of the signals obtained at the point $N_1$ and $N_2$ correspond to those of the first voltage $VCC_1$ equal to 5 V and to that of the second voltage $VCC_2$ equal to 3 V, as represented in FIG. 2a.

In a manner complementary to the converter circuit, which is the subject of the present invention represented in FIG. 1a, a low level/high level analogue level converter circuit 2 will now be described in conjunction with FIG. 1b.

Figure 1B:
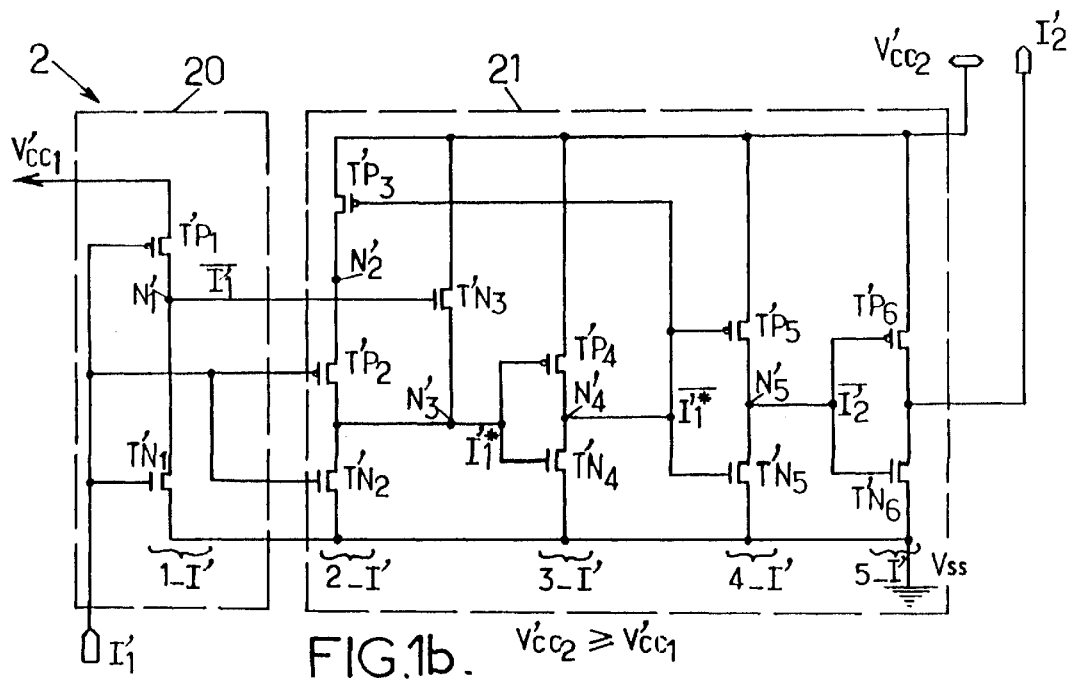

In the context of FIG. 1b, the first voltage value is denoted VICC, and the second voltage value is denoted $V'CC_2$, with $V'CC_2$ greater than or equal to $V'CC_1$.

In general, it is indicated that the value of the second voltage $V'CC_2$ in the case of the implementation of FIG. 1b is not necessarily equal to the value of the first voltage $VCC_1$ of FIG. 1a and that, in the same way, $V'CC_1$, the value of the first voltage in the case of the implementation of FIG. 1b, is not necessarily equal to the second voltage value $VCC_2$ in the case of the implementation of the converter device of FIG. 1a. Of course, the case of the respective equality of the aforementioned voltages allows the implementation both of the converter device represented in FIG. 1a as well as of the converter device represented in FIG. 1b so as to provide for the exchange of write/read signals, control signals, for example, between the central area C of the random access memory previously mentioned in the description and the aforementioned peripheral area P as will be described later in the description.

In the context of the implementation of the circuit for converting analogue levels which is the subject of the present invention, as represented in FIG. 1b, the first functional area of the integrated circuit is supplied from an electrical supply at a first voltage value $V'CC_1$ and the second functional area of this same integrated circuit is supplied from an electrical supply at a second voltage value, the voltage $V'CC_2$ mentioned previously, this second voltage value then being greater than or equal to the first voltage value.

Of course, just like in the case of FIG. 1a, the aforementioned voltage values are defined with respect to the same reference voltage, the earth voltage of the integrated circuit VSS.

The device for converting analogue levels 2 which is the subject of the present invention, as represented in FIG. 1b, then makes it possible to perform the voltage conversion of first logic signals $I'_1$ adapted to the first supply value V'CC, of the first functional area of the integrated circuit into second logic signals $I'_2$ adapted to the second supply voltage value $V'CC_2$ of the second functional area of this same integrated circuit. Naturally, it is understood that the conditions of adaptation to the supplies at the first and second voltage values correspond to those already indicated in the description.

As represented in the aforementioned FIG. 1b, the analogue level converter circuit 2 comprises, in succession, connected in cascade with respect to the common reference voltage VSS mentioned previously, an inverter stage denoted 1-I' bearing the reference 20, which receives on an input terminal a logic input signal consisting of the first logic signals, that is to say the signal $I'_1$, a signal whose analogue level is adapted to that of the first voltage value $V'CC_1$. The inverter stage 1-I'delivers an inverted logic input signal denoted $\bar{I}'_1$.

As represented in the aforementioned FIG. 1b, the inverter stage 1-I' can consist of a PMOS transistor $T'P_1$ whose drain electrode is connected to the first voltage value $V'CC_1$ and an NMOS type transistor $T'N_1$, the transistors $T'P_1$ and $T'N_{1N}$ being connected in series, the source electrodes of the transistors $T'P_1$ and $T'N_1$ being interconnected at a node or common point $N'_1$ and the drain electrode of the transistor $T'N_1$ being connected to the reference voltage VSS. The gate electrodes of the transistors $T'P_1$ and $T'N_1$ are interconnected in parallel and receive the aforementioned logic input signal $I'_1$.

Furthermore, the analogue level converter circuit 2 as represented in FIG. 1b comprises, supplied at the second voltage value $V'CC_2$, an amplifier converter module 21 which receives, on an input terminal, the inverted logic input signal $I'_1$ delivered by the abovementioned inverter stage 20, the amplifier converter module 21 delivering via amplification a converted logic input signal denoted $I'_2$ in phase with the logic input signal $I'_1$ and whose analogue level is adapted to that of the second voltage value $V'CC$. The converted logic input signal $I'_2$ constitutes the second logic signals obtained by conversion from the first logic signals constituting the logic input signal $I'_1$.

A more detailed description of the amplifier/converter module 21 will now be given in conjunction with FIG. 1b.

According to the aforementioned figure, the amplifier/converter module 21 advantageously comprises a first inverter stage denoted 2-I', this first inverter stage being interconnected with the second voltage value $V'CC_2$ by way of a PMOS type feedback transistor denoted $T'P_3$. The first inverter stage is thus formed by a PMOS type transistor $T'P_2$ interconnected in series with an NMOS type transistor $T'N_2$, the source electrode of the transistors $T'P_2$ and $T'N_2$ being interconnected in common at a point or node $N'_3$. The drain electrode of the feedback transistor $T'P_3$ is interconnected with the second supply voltage $V'CC_2$ and the source electrode of the transistor $T'P_3$ is interconnected at a node or common point $N'_2$ to the drain electrode of the transistor $T'P_2$. The drain electrode of the transistor $T'N_2$ is interconnected with the reference voltage VSS. Finally, the gate electrodes of the transistors $T'P_2$ and $T'N_2$ are interconnected in parallel and receive the logic input signal $I'_1$. The node $N'_3$, the output terminal of the first inverter stage 2-I', then delivers a replicated (for this reason denoted $I'*_1$) logic input signal exhibiting an analogue level substantially equal to that of the second supply voltage value $V'CC_2$.

Furthermore, the amplifier converter module 21 comprises a second inverter stage referenced 3-I', which receives, on an input terminal, the replicated logic input signal $I'*_1$ delivered by the first inverter stage 2-I'.

Furthermore, as will be observed in FIG. 1b, the amplifier/converter module 21 comprises an NMOS type cumulative control transistor denoted $T'N_3$, this cumulative control transistor being connected between the second voltage value $V'CC_2$ and the input of the second inverter stage 3-I', that is to say the aforementioned node $N'_3$. The gate electrode of the cumulative control transistor $T'N_3$ is linked to the output of the inverter stage 1-I', supplied with the first voltage value $V'CC_1$. The second inverter stage 3-I', formed by the transistors $T'P_4$ and $T'N_4$, delivers to the common point or node $N'_4$ interconnecting the source electrodes of the transistors $T'P_4$ and $T'N_4$ an inverted replicated logic input signal denoted $\bar{I}'_1$, the analogue level of which is adapted to that of the second voltage value $V'CC_2$. Furthermore, and according to a particularly advantageous aspect of the amplifier/converter module 21, the output of the second inverter stage 3-I', that is to say the node $N'_4$, which delivers the inverted replicated logic input signal $\bar{I}'*_1$, is feedback-interconnected with the gate electrode of the previously mentioned feedback transistor $T'P_3$.

Furthermore, the amplifier converter module 21 comprises a third inverter stage referenced 4-I' which receives the inverted replicated logic input signal $\bar{I}'*_1$ and delivers a calibrated replicated logic input signal denoted $\bar{I}'_2$. The third inverter stage 4-I' consists for example of a PMOS transistor $T'P_5$ whose drain electrode is connected to the second supply voltage $V'CC_2$ of an NMOS transistor $T'N_5$ connected in series with the transistor $T'P_5$, the source electrodes of the transistors $T'P_5$ and $T'N_5$ being connected at a common point or node, the node $N_5$ constituting the output which delivers the previously mentioned calibrated replicated logic input signal $\bar{I}'_2$. The drain electrode of the transistor $T'N_5$ is connected to the reference voltage VSS. The gate electrodes of the transistors $T'P_5$ and $T'N_5$ are connected in parallel to the node $N'_4$.

Finally, the amplifier/converter module 21 comprises a fourth inverter stage denoted 5-I' which receives the calibrated replicated logic input signal $\bar{I}'_2$ and delivers the converted logic input signal $I_2$, this signal being in phase with the logic input signal and the analogue level of which is equal to that of the second voltage value $V'CC_2$.

The low level/high level converter circuit for logic levels 2, represented in FIG. 1b, operates as follows.

When the logic input signal $I'_1$ goes from VSS=0 V to $V'CC_1$=3 V, the voltage at the node $N'_1$ goes to VSS=0 V, the cumulative control transistor $T'N_3$ thus being switched off. The voltage at the node $N'_3$ is equal to $V'CC_2$=5 V and the voltage at the node $N'_4$ is equal to VSS=0 V. The transistors $T'P_3$, the feedback transistor and $T'N_2$ are on. The transistor $T'P_2$ is also on since the gate electrode of the latter is at a potential difference of 2 V ($V'CC_2$–$V'CC_1$) with respect to its source electrode, the node $N'_2$. The voltage at the node $N'_2$ drops slightly until the transistor $T'P_2$ passes to the off state. The transistor $T'N_2$ being in the on state, the voltage at the node $N'_3$ toggles to VSS=0 V and the voltage at the node $N_4$ consequently toggles to the value $VICC_2$=5 V, this having the effect of switching off the feedback transistor $T'P_3$ by cutting the current drawn by the branch consisting of transistor $T'P_3$, transistor $T'P_2$, transistor $T'N_2$, first inverter 2-I in series with the transistor $T'P_3$. The voltage at the node $N'_5$ goes to VSS=0 V and the converted logic signal $I_1$' delivered by the output of the fourth inverter 5-I' goes to $V'CC_2$=5 V.

When the logic input signal goes from $V'CC_1$=3 V to VSS=0 V, the voltage at the node $N'_1$ goes to $V'CC_1$=3 V and the transistor $T'N_3$ is turned on since the latter's gate voltage, at the node $N'_1$, is then greater than its source voltage, at the node $N'_3$ which, initially is at VSS=0 V. The transistor $TIP_2$ is turned on while the transistor $T'P_3$ is off since the voltage on the gate electrode of the latter, the node $N'_{41}$ is at $V'CC_2$=5 V. This has the effect, on feedback control, of causing the voltage at the node $N'_2$ to drop. Jointly, the voltage at the node $N'_3$ rises under the effect of the conducting of the transistor $T'N_3$, this causing the toggling of the voltage at the node $N'_4$ to VSS=0 V. This toggling turns on the feedback transistor $T'P_3$ and causes the potential of the node $N'_2$ to rise to the voltage $V'CC_2$=5 V. The voltage at the node $N'_4$ being at VSS=0 V, the voltage at the node $N'_5$, the output of the third inverter 4-I', toggles to V'CC$_2$=5 V and the converted logic signal I'$_2$ delivered by the fourth inverter 5-I' goes to VSS=0 V.

Figure 2B:
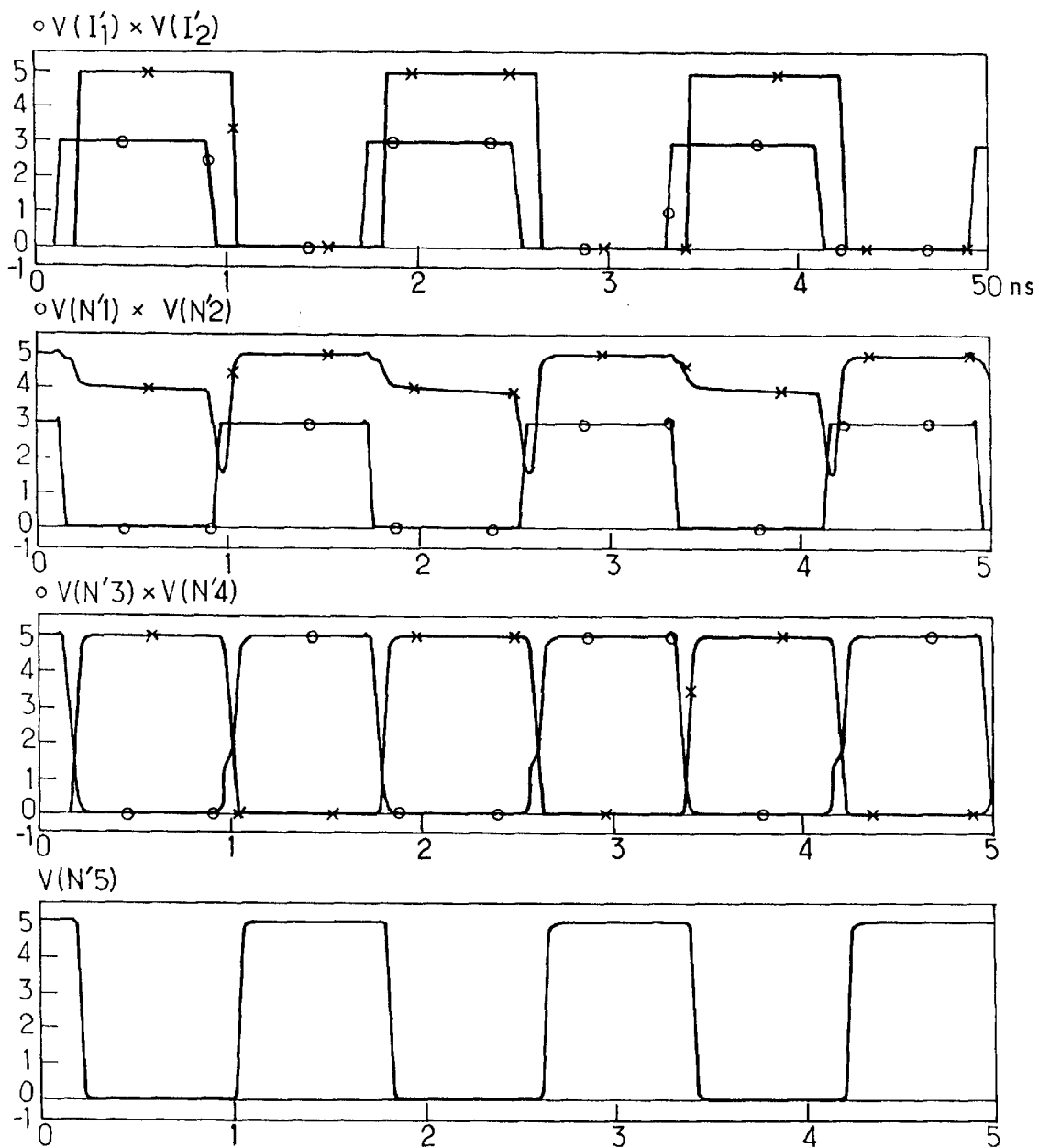

Represented in FIG. 2b is a timing diagram of the noteworthy signals of the converter circuit 2 which is the subject of the present invention as represented in FIG. 1b. These noteworthy signals are the signals present at the test points N'$_1$, N'$_2$, N'$_3$, N'$_4$ and N'$_5$ when the logic input signal I'$_1$ corresponds to a signal whose analogue level is adapted to that of the first supply voltage V'CC$_1$, that is to say in the example given above, for V'CC$_1$=3 V, to a peak amplitude value of 3 V, the converted logic signal constituting the second logic signals, that is to say the signal I'$_2$ obtained and adapted to the second supply voltage value V'CC$_2$, this signal thus exhibiting a peak value equal to 5 V in the aforementioned example embodiment for V'CC$_2$=5 V. It is indicated that in the same way as in the case of the embodiment of FIG. 1a, the converted signal I'$_2$ is in phase with the input signal to within the switching delay, which does not exceed 50 ns. An intermediate graduation of the abscissa axis in FIG. 2b corresponds to the aforementioned value 10 ns.

Of course, a particularly interesting case of the implementation of logic signal analogue level converter circuits 1 and 2 such as represented in FIGS. 1a and 1b corresponds to the situation in which the first supply voltage VCC$_1$ in the case of FIG. 1a is equal to the second supply voltage V'CC$_2$ corresponding to the case of the embodiment of FIG. 1b and in which the first supply voltage V'CC$_1$ of the embodiment of FIG. 1b is equal to the second supply voltage VCC$_2$ of the embodiment of FIG. 1a.

In such a case, as will now be described in more detail in the description, the analogue level converter circuits previously described in FIGS. 1a and 1b may be combined to produce an analogue level converter for logic input signals, logic control signals and logic output signals exchanged between the central area constituting the first functional area of a random access memory and the peripheral area constituting the second functional area, the area for access to this random access memory, of an integrated circuit.

A first embodiment of such a converter will be described in conjunction with FIG. 3a in the non-limiting case in which this converter is used for example in an integrated circuit of random access memory type containing a first functional area consisting of a set of memory cells, that is to say the central part C previously mentioned in the description and of a second functional area consisting of circuits for access to these memory cells, the aforementioned peripheral area P.

The first functional area is supplied with a supply voltage at a first voltage value VCC$_1$ equal to 5 V, for example, the second functional area is supplied from an electrical supply and a second supply value VCC$_2$ equal to 3 V, for example. The second voltage value is less than the first voltage value. The first functional area delivers to the second functional area, logic input signals denoted I$_1$, logic control signals denoted E$_1$ whose analogue level is adapted to the first voltage value, as mentioned previously in the description.

The second functional area delivers to the first functional area, logic output signals denoted O$_2$, these logic output signals of course being at an analogue level adapted to the second abovementioned voltage value, that is to say to the value 3 V, in the example embodiment described earlier.

Figure 3A:
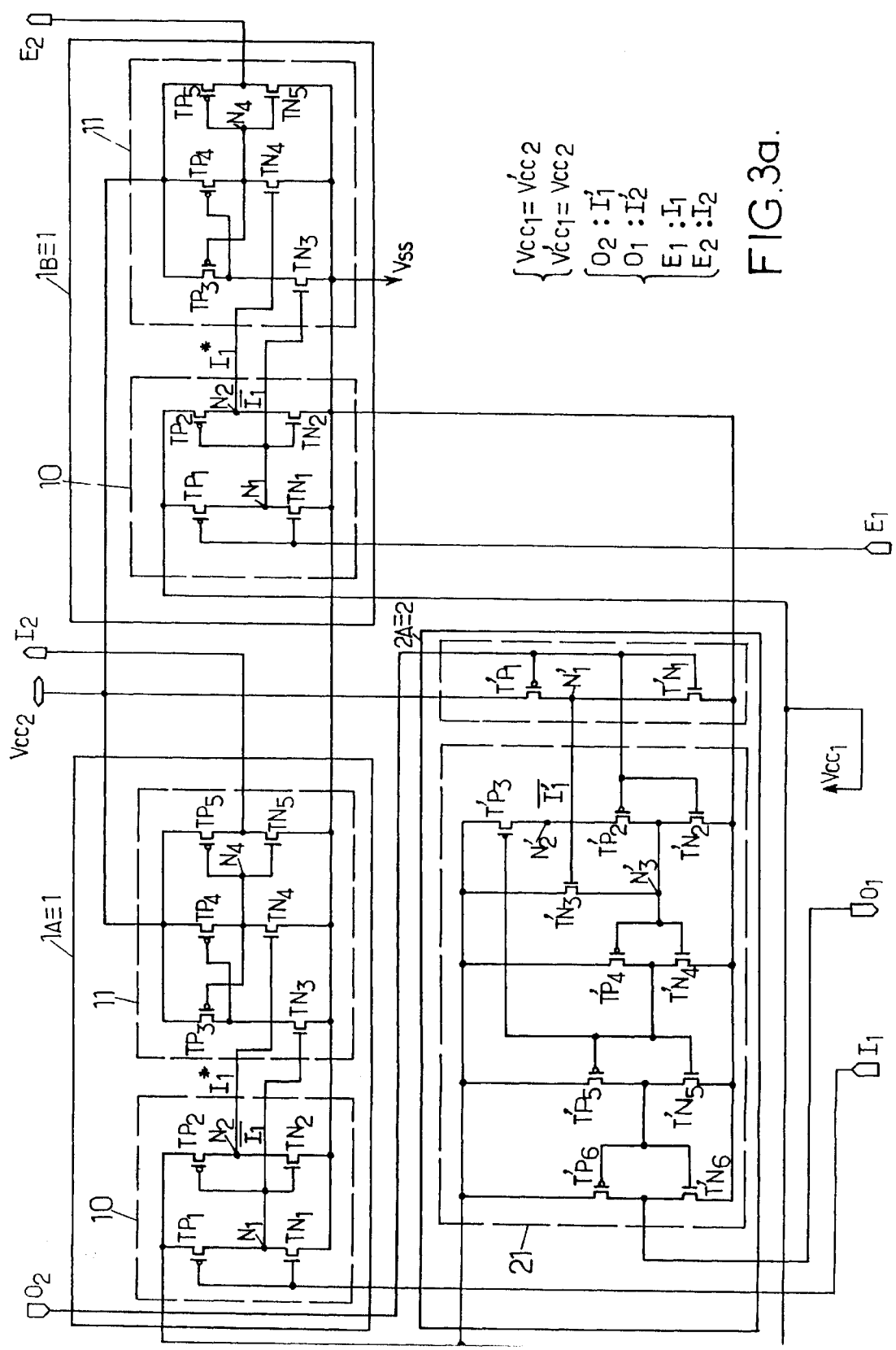
FIG. 3$a$ represents a converter of analogue levels of logic signals, input signals, control signals and output signals exchanged between the central part of a random access memory supplied at a first voltage value and the peripheral part for access to this central part, supplied at a second voltage value, less than the first voltage value.

The converter which is the subject of the present invention, as represented in FIG. 3a, makes it possible to effect on the one hand, the conversion of the signals I$_1$, the logic input signals, and E$_1$, the control input signals at an analogue value adapted to the first supply value, these signals being delivered by the first area, into input signals I$_2$ and control signals E$_2$ at an analogue value adapted to the second voltage value VCC$_2$, that is to say 3 V, of the second functional area, and, on the other hand, the output signals O$_2$ delivered by the second functional area, at an analogue value adapted to the second supply voltage value VCC$_2$, into output signals O$_1$ whose analogue value is adapted to the first supply value VCC$_1$ of the first functional area.

For this purpose, as represented in the aforementioned FIG. 3a, the converter comprises at least, interconnected with respect to the same reference voltage, a first circuit for converting analogue levels of logic input signals, such as referenced 1A corresponding strictly to the converter circuit represented in FIG. 1a, this converter circuit 1A receiving the logic input signals I$_1$ constituting first input signals in respect of the converter circuit 1A. This first converter circuit 1A consequently delivers, on the basis of these first input signals, a first converted logic input signal, denoted I$_2$, the analogue level of which is adapted to that of the second voltage value, the value VCC$_2$ equal to 3 V.

In the same way, as represented in the aforementioned FIG. 3a, the converter comprises a second circuit for converting analogue levels, of the logic control signals, the signals E$_1$, this second converter circuit, denoted 1B, being strictly identical to the converter circuit 1A and consequently to the converter circuit represented in FIG. 1a. The second converter circuit 1B receives the logic control signals E$_1$ constituting second input signals in respect of this second converter circuit 1B. The second converter circuit 1B delivers, on the basis of the second input signals E$_1$, control signals, a second converted logic control signal, denoted E$_2$, the analogue level of which is adapted to that of the second voltage value VCC$_2$, that is to say 3 V. Finally, the converter represented in FIG. 3a comprises a third circuit for converting analogue levels, of the logic output signals, this third converter circuit bearing the reference 2A being strictly identical to the converter circuit represented in FIG. 1b. However, and solely for the purpose of simplifying the representation of the converter circuit 2A in the context of the converter represented in FIG. 3a, the direction of propagation of the signals, for the converter circuit 2A, being from right to left in FIG. 3a whereas it is from left to right in the case of FIG. 1b, the representation of the elements of the converter circuit 2A of FIG. 3a is symmetric with that of FIG. 1b, the same references denoting the same elements however.

For the third converter circuit 2A and for the converter represented in FIG. 3a, the logic output signals O$_2$ constitute third input signals. These third input signals exhibit an analogue value adapted to the second voltage value VCC, equal to 3 V in the example considered for the second functional area. The third converter circuit 2A delivers a converted logic output signal, denoted O$_1$, whose analogue level is adapted to that of the first voltage value, VCC$_1$ equal to 5 V in the example considered. It will thus be understood that the converter of analogue signals which is the subject of the present invention, as represented in FIG. 3a, and consisting in fact of two converter circuits such as represented in FIG. 1a, the converter circuits 1A and 1B, and of a converter circuit such as represented in FIG. 1b, the converter circuit 2A, thus makes it possible to effect a conversion of the analogue level of the logic signals generated by the first functional area supplied at a supply voltage at a high level VCC$_1$=5 V into input signals and control signals whose analogue value is at a lower level VCC$_2$=3 V for an area consisting of memory cells supplied at this second analogue value, as well as on the other hand, a conversion of the signals delivered at this second analogue value by the aforementioned memory area at the value 3 V, $O_2$, into output signals $O_1$ whose analogue value is adapted to that of the supply voltage of the first functional area, supplied at the value 5 V. It is understood in particular that in the converter represented in FIG. 3a, the output signal $O_2$ from the second functional area plays the part of the input signal $I'_1$ of FIG. 1b, the converted output signal $O_1$ plays the part of the signal $I'_2$ of FIG. 1b, the control signal $E_1$ plays the part of the input signal $I_1$ of FIG. 1a and the converted control signal $E_2$, obtained after conversion, plays the part of the signal $I_2$ of FIG. 1a.

Of course, the converter circuits represented in FIGS. 1a and 1b also make it possible to implement an analogue level converter of logic signals delivered by a first functional area, consisting for example of a set of memory cells, of a random access memory, and of a second functional area consisting of buffer circuits when the aforementioned first functional area is supplied from an electrical supply at a first voltage value $V'CC_1$ equal to 3 V, for example, and when the second functional area is on the contrary supplied from an electrical supply at a second voltage value $V'CC_2$ equal to 5 V, for example. In that case and in a manner similar to the embodiment of the converter represented in FIG. 3a, it is indicated that in respect of the embodiment of the converter represented in FIG. 3b, by convention, $V'CC_1=VCC_2$ and $VCC_1=V'CC_2$, the values of the voltages represented in FIGS. 1a and 1b respectively.

In this case, the second voltage value $V'CC_2$ is therefore greater than the first voltage value. Furthermore, the first functional area delivers to the second functional area, logic input signals and logic control signals, the logic input signals being denoted in the case of FIG. 3b, $I'_1$ and the logic control signals being denoted $E'_1$. Of course, these logic signals have an analogue level adapted to the first supply voltage value, that is to say to the value $V'CC_1=3$ V in the example embodiment.

The second functional area delivers to the first functional area, logic output signals denoted $O'_2$, these logic signals being at an analogue level adapted to the second voltage value $V'CC_2=5$ V in the example embodiment.

Figure 3B:
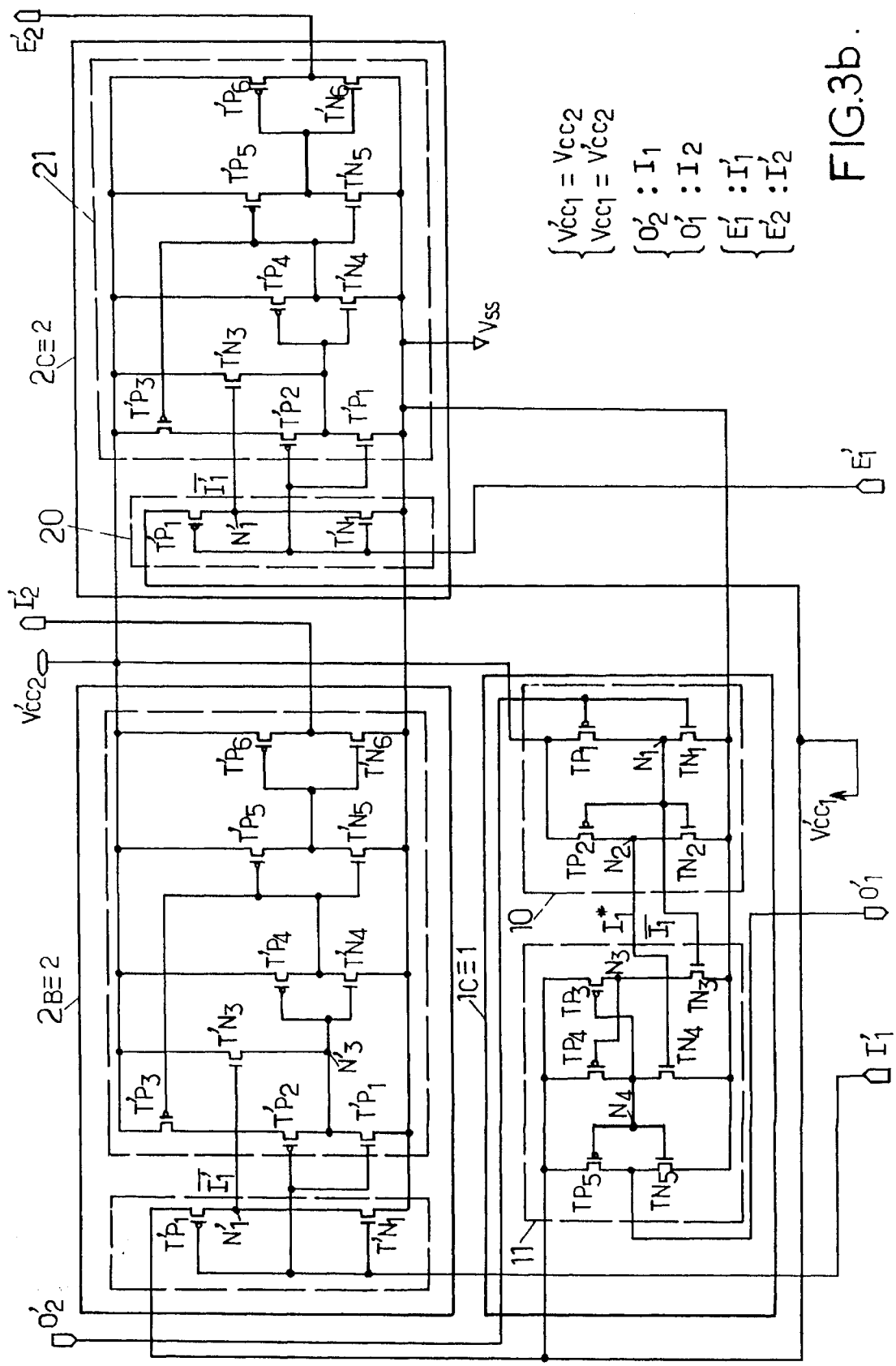

Under these conditions, the converter of analogue levels of the logic input signals, of the logic control signals and of the logic output signals previously mentioned comprises at least, as represented in FIG. 3b, and interconnected with respect to the same reference voltage VSS, a first circuit for converting analogue levels of logic input signals bearing the reference 2B, this converter circuit 2B being strictly identical to the converter circuit as represented in FIG. 1b. The first analogue level converter circuit 2B receives logic input signals, the signals $I'_1$, constituting first input signals in respect of this first converter circuit and delivers a first converted logic input signal denoted $I'_2$ whose analogue level is of course adapted to that of the second voltage value $V'CC_2$, that is to say in the example embodiment given, equal to 5 V.

Likewise, the analogue level converter represented in FIG. 3b comprises a second circuit for converting analogue levels, of the logic control signals, this second converter circuit bearing the reference 2C in the aforementioned figure.

The second converter circuit 2C is strictly identical to the converter circuit 2B and to the converter circuit represented in FIG. 1b. The second converter circuit 2C receives the logic control signals denoted $E'_1$, these constituting, in respect of the converter and in respect of this second converter circuit 2C, second input signals on the basis of which the second converter circuit 2C delivers a second converted logic control signal denoted E', whose analogue level is adapted to that of the second voltage value $V'CC_2$, that is to say 5 V.

Finally, the analogue level converter represented in FIG. 3b comprises a third circuit for converting analogue levels bearing the reference 1C making it possible to effect the conversion of the logic output signals $O'_2$ delivered by the second functional area into logic output signals $O'_1$ whose analogue level is adapted to the supply voltage of the first functional area, that is to say to the value $V'CC_1$ equal to 3 V.

Of course, the third circuit for converting analogue levels 1C is strictly identical to the analogue converter circuit represented and described in FIG. 1a. It receives the aforementioned logic output signals $O'_2$, these signals constituting in respect of the converter and in respect of this third converter circuit 1C, third input signals on the basis of which this third converter circuit 1C delivers a converted logic output signal, the aforementioned signal $O_1$, whose analogue level is equal to that of the first voltage value $V'CC_1$ equal to 3 V.

It will thus be understood that the converter of analogue levels, represented in FIG. 3b, allows the conversion of the input signals $I'_1$ and of the control signals $E'_1$ from a low logic level to a high logic level adapted to the supply voltage of the second functional area whereas on the contrary, it furthermore allows the conversion of the logic output signals O', of the second functional area from a high logic level to a low logic level adapted to the supply value of the first functional area.

It is likewise understood that in the case of the embodiment of the converter such as represented in FIG. 3b, the output signal $O'_2$ delivered by the second functional area plays the part of the signal I. in the case of FIG. 1a, the signal $O'_1$ plays the part of the signal $I_2$ of the same FIG. 1a, the signal $E'_1$ plays the part of the signal $I'_1$ in the case of the converter circuit of FIG. 1b and the signal $E'_2$ plays the part of the signal $I'_2$ of the same FIG. 1b. Finally, it is recalled that in FIG. 3b, the converter circuit 1C, for the same reason as previously in the case of FIG. 3a, that is to say for the purposes of simplifying the representation of FIG. 3b bearing in mind the direction of propagation of the input signals from right to left for the converter circuit 1C, whereas in the case of FIG. 1a the direction of propagation of the signals is from left to right, the installation of the elements 10 and 11 is reversed with respect to the corresponding elements of the converter circuit of FIG. 1a, however the same references of course denote the same elements.

Figure 4:
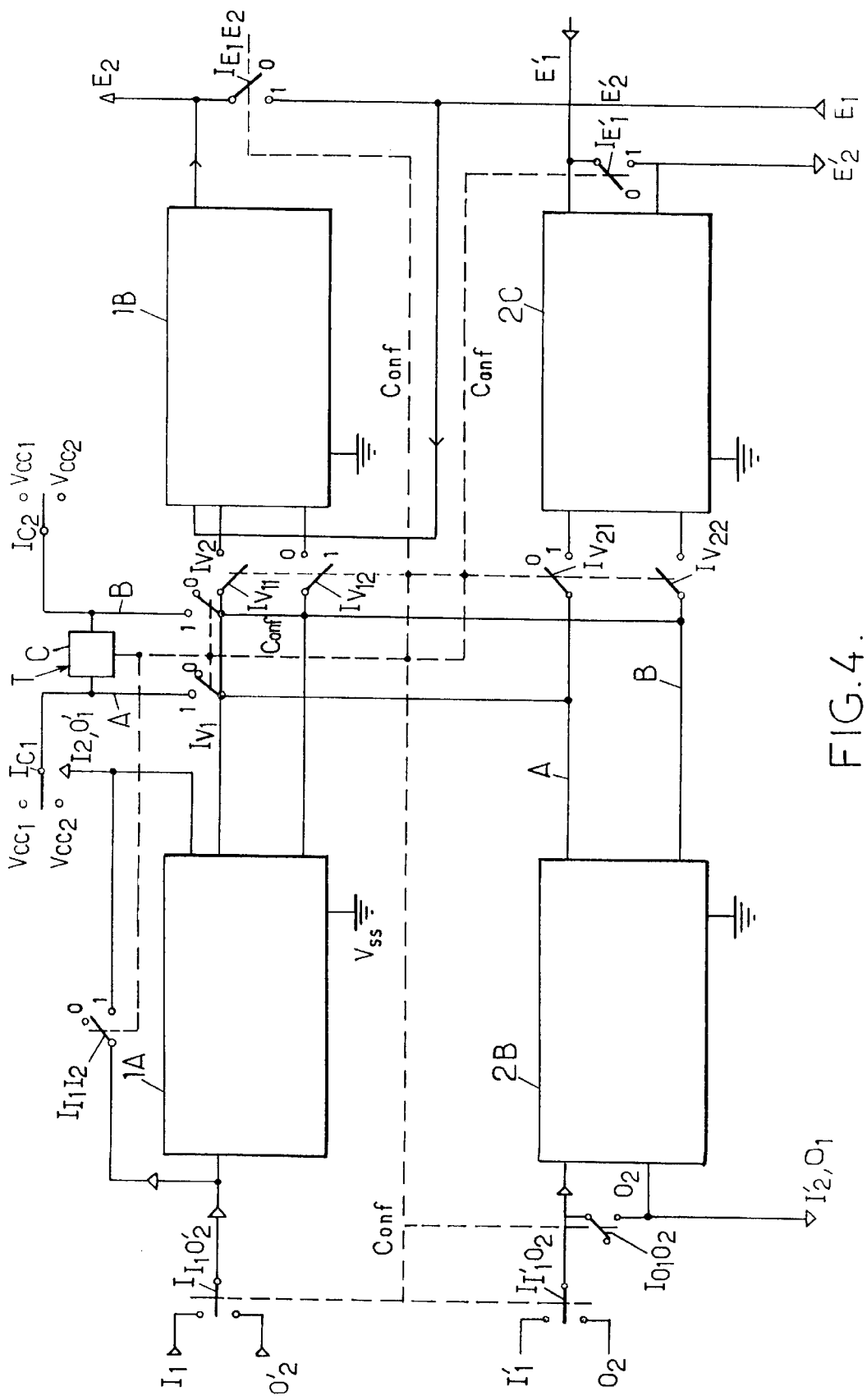
FIG. 4 represents an installation diagram for a converter of analogue levels of logic signals, input signals, control signals and output signals exchanged between the central part of a random access memory and the peripheral part for access to this central part, it being possible for this central part and this peripheral part to be supplied from a supply which can be switched between a first and a second voltage value, this second voltage value being less than, equal to or greater than the first voltage value, this converter being automatically configurable as a function of the relative value of the first and of the second voltage value.

FIG. 4 represents a configurable converter of analogue levels of logic input signals, of logic control signals and of logic output signals exchanged between the first and the second voltage value supplying the first and the second functional area of an integrated circuit such as a random access memory as described previously in the description.

However, according to a particularly advantageous aspect of the converter which is the subject of the present invention, the first functional area, consisting for example of the set of memory cells and of a second functional area formed by the aforementioned buffer circuits, are such that the first functional area is supplied from an electrical supply which can be switched between a first and a second voltage value, the second voltage value being less than, equal to or greater than the first voltage value, these voltage values being denoted $VCC_1$ and $VCC_2$, the second functional area being supplied from an electrical supply which likewise can be switched between these first and second aforementioned voltage values.

Represented in FIG. 4 are two supply lines denoted A, B, which can be taken to the potential of the first respectively second voltage value $VCC_1$, $VCC_2$ by way of a switch $IC_1$ and $IC_2$ respectively.

The first functional area delivers to the second functional area, logic input signals and logic control signals, these signals corresponding with the same designation to the signals $I_1$ and $E_1$ of FIG. 3a.

In the same way, the second functional area delivers to the first functional area, logic output signals $O_2$ bearing the same reference as in the case of FIG. 3a.

As will be observed in the aforementioned FIG. 4, the configurable converter, which is the subject of the present invention, comprises at least, connected with respect to the same reference voltage VSS, a first, denoted 1A, and a second denoted 1B, analogue level converter circuit, such as represented in FIG. 1a. The first and the second converter circuit 1A and 1B are supplied from the aforementioned supply lines A, B by way of programmable interrupters denoted $IV_1$ and $IV_2$ respectively.

Furthermore, the first and the second converter circuit 1A and 1B receive logic signals to be converted, these logic signals consisting of the logic input signals $I_1$, the logic control signals $E_1$ and the logic output signals $O'_2$ delivered by the second functional area. The first converter circuit 1A receives either the logic input signal $I_1$, or the logic output signal $O'_2$ by way of a programmable switch denoted $I_{I10'2}$ and the second converter circuit 1B receives as input the control signal delivered by the first functional area $E_1$.

Furthermore, as will be observed in FIG. 4, the conversion input of the first converter circuit 1A which receives either the logic input signal $I_1$, or the logic output signal $O'_2$ is connected to the output of the converter circuit 1A which delivers the converted logic signal $I_2$ or $O'_1$ by way of a programmable interrupter denoted $I_{I1I2}$.

The same holds for the converter circuit 1B for which the conversion input which receives the control signal $E_1$ delivered by the first functional area is linked to the output which delivers the converted logic control signal $E_2$ by way of a programmable interrupter denoted $I_{E1E2}$. Furthermore, the second converter circuit 1B is linked to the supply lines A and B in series with the programmable interrupters $IV_1$ and respectively $IV_2$ by way of a programmable interrupter denoted $IV_{11}$ and $IV_{12}$ respectively.

A comparator circuit C is provided, which receives the value of the supply voltage delivered by the lines A and B respectively, the comparator circuit C consisting, for example, of a voltage comparator making it possible to deliver a logic variable denoted Conf on 2 bits making it possible actually to represent the state of the supply switches $IC_1$ and $IC_2$, that is to say the value of the voltages $VCC_1$ or $VCC_2$ present on the supply lines A and B.

By way of non-limiting example, it is indicated that when the supply voltage is the same on the lines A and B and equal either to the first supply voltage $VCC_1$, or to the second supply voltage $VCC_2$, the logic variable Conf can, for example, have the value 00. On the con- trary, when the supply voltages on the lines A and B have different values, the logic variable Conf can then take the value 10, respectively 01 as represented by way of non-limiting example for $VCC_1$ equals 5 V and $VCC_2$ equals 3 V in Table 1 below.

TABLE 1

Value of Conf as a function of $V_A$, $V_B$

| $V_A$ | $V_B$ | |
|---|---|---|
| | $VCC_1$ | $VCC_2$ |
| $VCC_1$ | 00 | 01 |
| $VCC_2$ | 10 | 00 |

Of course, the logic variable Conf is delivered to each aforementioned programmable interrupter by way of a bus link with two conductors, and which for this reason is represented dashed in FIG. 4.

It is thus understood that the comparator C, linked by the aforementioned bus link to the programmable interrupters $I_{I10'2}$, $I_{E1E2}$, $I_{I1I2}$, $IV_1$, $IV_2$ and $IV_{11}$ and $IV_{12}$ thus constitute first switching elements which make it possible by coupling to apply, for example, to the first and second converter circuits 1A and 1B the logic input signal $I_1$ for the converter circuit 1A, this signal constituting the first signals, as well as the logic control signals $E_1$ to the second converter circuit 1B, constituting second signals in respect of this second converter circuit. The first converter circuit 1A therefore delivers, on the basis of the first signals $I_1$, a first converted logic input signal, that is to say the signal $I_2$ whose analogue level is equal to that of the second voltage value. On the contrary, when the output signal $O'_2$ is applied to the input of the converter circuit 1A, the latter delivers a converted output signal $O'_1$, whose analogue level is adapted to that of the first voltage value supplying the first functional area.

The second converter circuit 1B delivers, on the basis of the second signals, that is to say of the logic control signal $E_1$, a converted logic control signal $E_2$ whose analogue level is equal to that of the second voltage value. The logic output signals $O'_2$ constituting the third signals are applied, for example, in the case of FIG. 4, to the first converter 1A by way of the programmable interrupter $I_{I10'2}$.

Thus, the first converter circuit 1A and the second converter circuit 1B make it possible to deliver, as a function of their configuration, a converted output signal whose analogue level is equal to that of the second voltage value or, as far as the converter circuit 1A is concerned, when the latter receives the output signals $O'_2$ a converted signal at the first voltage value, that is to say the signal $O'_1$.

Furthermore, the configurable converter represented in FIG. 4 comprises a third 2B and a fourth 2C circuit for converting analogue levels of logic signals, this third and this fourth converter circuit being strictly identical to the converter circuits represented in FIG. 1b. The third converter circuit 2B is supplied by way of programmable interrupters $IV_1$ and $IV_2$ respectively.

The fourth converter circuit 2C is supplied from these same programmable interrupters via the aforementioned lines A and B by way furthermore of programmable interrupters $IV_{21}$ and $IV_{22}$ respectively.

The third converter circuit 2B receives by way of a programmable interrupter $I_{I'102}$, either the input signal $I'_1$, a logic input signal delivered by the first functional area to the second functional area in the case of FIG. 1b, or on the contrary, the output signal $O_2$ delivered by the second functional area in the case of FIG. 3a. The third converter circuit 2B delivers, as a function of the input signal, a converted logic signal corresponding either to the converted logic signal $I'_2$ of FIG. 1b, or to the converted output signal $O_1$ of FIG. 3a. Furthermore, the conversion input of the third converter circuit 2A and the output of this third converter circuit are linked by way of a programmable interrupter denoted $I_{O1O2}$.

The fourth converter circuit 2C receives the control signal $E'_1$ on its conversion input and delivers the converted control signal $E'_2$ as represented in FIG. 3b. The conversion input and the output delivering the converted logic signal are linked by way of a programmable interrupter denoted $E_{1E'2}$. Of course, the programmable interrupters $I_{I'102}$, $I_{O1O2}$, $IV_{21}$, $IV_{22}$ and $I_{E'1E'2}$ are linked by the bus link so as to receive the configuration logic variable Conf.

It is thus understood that the switching module C, associated with the aforementioned programmable interrupters, in fact constitutes a second switch control element making it possible by coupling to apply to one of the third, respectively, fourth logic signal analogue level converter circuits 2B and 2C the aforementioned logic signals. The third and the fourth converter circuits 2B, 2C, deliver, on the basis of these third signals, a converted output signal whose analogue level is equal to that of the first, respectively of the second voltage value. The second aforementioned switch control elements likewise make it possible to apply to the third 2B and to the fourth converter circuit 2C the logic input signals $I'_1$ constituting the first signals, respectively the logic control signals $E'_1$ constituting the second signals. Under these conditions, the third converter circuit 2B delivers, on the basis of the first signals, a first converted logic input signal $I'_2$ whose analogue level is equal to that of the second voltage value while the fourth converter circuit 2C delivers, on the basis of the second signals, that is to say of the control signal $E'_1$ the converted logic control signal $E'_2$ whose analogue level is equal to that of the second voltage value.

It is of course understood that as far as the programmable interrupters $I_{I1I2}$, $I_{E1E2}$, $I_{O1O2}$, $I_{E'1E'2}$, are concerned, these latter, in the normally open position when the voltages on the supply lines A and B are different, are brought into the closed position when the supply voltages on the lines A and B are identical so as to allow the direct transmission of the logic input signals to the output, each conversion circuit 1A, 1B, 2B and 2C then being short-circuited so as to allow the direct transmission in the absence of any conversion of analogue levels of the logic signals issuing from one of the functional areas to the other functional area by virtue of the fact that the supply voltages of these latter are identical. In the aforementioned case, it is indicated that through the implementation of the interrupters $IV_1$, $IV_2$, $IV_{11}$, $IV_{12}$, $IV_{21}$ and $IV_{22}$, the conversion circuits 1A, 1B and 2B, 2C are then disconnected from the supply lines, this making it possible to reduce the overall consumption of the corresponding integrated circuit.

A table, Table 2, giving the values of the position of the programmable interrupters as a function of the configuration logic variable Conf is given below, the value 0 indicating the open position of the programmable interrupter and the value 1 indicating its closed position.

It will be understood in particular that through the implementation on the one hand of the interrupters $IC_1$ and $IC_2$ allowing switching from one voltage value to another voltage value and of the comparator C associated with the aforementioned programmable interrupters, these switching elements constitute, associated with the comparator C, an element for managing the first and second switching elements. It is thus understood that these management elements in fact make it possible to reconstruct the configuration of FIG. 3a or of FIG. 3b by connecting three of the converter circuits 1A, 1B and 2B, 2C of FIG. 4a out of the four converter circuits installed, on the criteria of excluding the simultaneous coupling of the first, of the second, of the third and of the fourth aforementioned analogue level converter circuits, and of the coupling of three out of four converters so as to effect, either the high analogue level/high analogue level conversion and vice versa, between first functional area and second functional area by coupling of the first, of the second and of one of the third or fourth converter circuits, or on the contrary the low analogue level/low analogue level conversion and vice versa between the first functional area and the second functional area, by coupling of one of the first or second converter circuits and of the third and fourth converter circuits when the supply voltages on the supply lines A and B are different. When, on the contrary, the supply voltages on the supply lines A and B are identical, the conversion between the same high respectively low logic level can be achieved by simple transmission by virtue of the implementation of the short-circuit programmable interrupters mentioned previously in the description. According to a particularly advantageous aspect of the configurable converter which is the subject of the present invention, represented in FIG. 4, it is indicated when the supply voltages on the supply lines A and B are identical, the interrupters $I_{I1I2}$, $I_{E1E2}$, $I_{O1O2}$ and $I_{E'1E'2}$ can without disadvantage be maintained in the open state, since each converter 1A, 1B, 2B or 2C effects the conversion procedure in a totally transparent manner. This configuration can then be obtained by means of the specific value of the configuration variable Conf=11, this allowing control of the aforementioned interrupters as a consequence. To this end, the comparator C can then be provided with an input control T, on the initiative of the user, enabling the latter to select operation in transparent mode.

It is thus understood that the configurable converter which is the subject of the present invention, as represented in FIG. 4, appears particularly adapted to use on integrated circuits in which the configuring of the supply is achieved by way of the interrupters $IC_1$ and $IC_2$ as a function of the hardware available. A particularly advantageous application relates especially to the random memory circuits for portable microcomputers in which it is advantageous, depending on the application considered, to favour either the speed of execution, that is to say of reading of the random memory, at the cost however of considerable consumption, or on the contrary the operating endurance of these circuits at the cost however of a slower speed. It is understood in particular that in this application the interrupters $IC_1$ and $IC_2$ can also

TABLE 2

| Conf | $IV_2$ | $IV_3$ | $IV_{11}$ | $IV_{12}$ | $IV_{21}$ | $IV_{22}$ | $I_{I1O3}$ | $I_{I1I2}$ | $I_{E1E2}$ | $E_{E'1S3}$ | $I_{I'1O2}$ | $I_{O1O2}$ |
|---|---|---|---|---|---|---|---|---|---|---|---|---|
| 00 | 0 | 0 | 0 | 0 | 0 | 0 | 1 | 1 | 1 | 1 | 1 | 1 |
| 01 | 1 | 1 | 1 | 1 | 0 | 0 | 1 | 0 | 0 | 0 | 0 | 0 |
| 10 | 1 | 1 | 0 | 0 | 1 | 1 | 0 | 0 | 0 | 0 | 0 | 0 | consist of programmable interrupters, controlled at the behest of the user of the portable computer.

What is claimed is:

1. A circuit for converting analogue levels of first logic signals of a first functional area of an integrated circuit, said first functional area being supplied from an electrical supply at a first voltage value, into second logic signals of a second functional area of said integrated circuit, said second functional area being supplied from an electrical supply at a second voltage value, less than or equal to said first voltage value, these values being defined with respect to a same reference voltage, wherein said circuit comprises, connected in succession in cascade with respect to said common reference voltage:

converter means supplied at said first voltage value and receiving on an input terminal a logic input signal consisting of said first signals and whose analogue level is adapted to that of said first voltage value, said converter means delivering a replicated logic input signal and an inverted logic input signal, whose analogue level is adapted to that of said first voltage value, and differential converter means, supplied at said second voltage value and receiving said replicated logic input signal and said inverted logic signal, said differential converter means delivering a converted logic input signal in phase with said logic input signal and whose analogue level is adapted to that of said second voltage value, said converted logic input signal constituting said second logic signals.

2. The circuit of claim 1, wherein said converter means comprise:

a first inverter stage receiving said logic input signal on an input terminal and delivering said inverted logic input signal;

a second inverter stage, interconnected with said first inverter stage, receiving said inverted logic input signal and delivering said replicated logic input signal.

3. The circuit of claim 1, wherein said differential converter means comprise:

a differential amplifier stage receiving said inverted logic input signal on a first differential input and said replicated logic input signal on a second differential input, and delivering an amplified difference logic signal;

an inverter stage which receives said amplified difference logic signal and delivers a converted logic input signal in phase relationship with said logic input signal and whose analogue level is adapted to that of said second voltage value.

4. A circuit for converting analogue levels of first logic signals of a first functional area of an integrated circuit, said first functional area being supplied from an electrical supply at a first voltage value, into second logic signals of a second functional area of said integrated circuit, said second functional area being supplied from an electrical supply at a second voltage value, greater than or equal to said first voltage value, these values being defined with respect to a same reference voltage, said circuit for converting comprising, connected in succession in cascade, with respect to said common reference voltage, an inverter stage supplied at said first voltage value and receiving on an input terminal an input logic signal consisting of said first signals and whose analogue level is adapted to that of said first voltage value, said inverter stage delivering an inverted logic input signal and, cascade connected to said inverter stage, amplifier converter means supplied at said second voltage value receiving said inverted logic input signal on an input terminal and delivering, via amplification, a converted logic input signal in phase relationship with said logic input signal and whose analogue level is adapted to that of said second voltage value, said converted logic input signal constituting said second logic signals, wherein said amplifier converter means comprise:

a first inverter stage interconnected with said second voltage value by way of a feedback transistor, said first inverter stage receiving said logic input signal and delivering a replicated logic input signal at an analogue level substantially equal to that of said second voltage value;

a second inverter stage receiving on an input terminal said replicated logic input signal delivered by said first inverter stage;

a cumulative control transistor connected between said second voltage value and the input of said second inverter stage, the gate electrode of said cumulative control transistor being connected to the output of said inverter stage supplied with said first voltage value, said second inverter stage delivering on a second inverter stage output an inverted replicated logic input signal at an analogue level adapted to that of said second voltage value, said second inverter stage output being feedback-inter-connected with the gate electrode of said feedback transistor;

a third inverter stage receiving said inverted replicated logic input signal and delivering a calibrated replicated logic input signal;

a fourth inverter stage receiving said calibrated replicated logic input signal and delivering said converted logic input signal in phase relationship with the logic input signal and whose analogue level is adapted to that of said second voltage value.

5. In an integrated circuit of random access memory type comprising a first functional area consisting of a set of memory cells and a second functional area consisting of buffer circuits, said memory cells being accessible by way of said buffer circuits, said first functional area being supplied from an electrical supply at a first voltage value and said second functional area being supplied from an electrical supply at a second voltage value, less than or equal to said first voltage value, said first functional area delivering to said second functional area logic input signals and logic control signals at an analogue level adapted to said first voltage value and said second functional area delivering to said first functional area logic output signals at an analogue level adapted to said second voltage value, a converter of analogue levels of said logic input signals, said logic control signals and said logic output signals comprising at least, interconnected with respect to a same reference voltage:

a first converter circuit for converting analogue levels of said logic input signals, said first circuit for converting comprising connected in succession in cascade with respect to said common reference voltage:

converter means supplied at said first voltage value and receiving on an input terminal a logic input signal consisting of said first signals and whose analogue level is adapted to that of said first voltage value, said converter means delivering a replicated logic input signal and an inverted logic input signal, whose analogue level is adapted to that of said first voltage value, and differential converter means, supplied at said second voltage value and receiving said replicated logic input signal and said inverted logic signal, said differential converter means delivering a converted logic input signal in phase with said logic input signal and whose analogue level is adapted to that of said second voltage value, said converted logic input signal constituting said second logic signals, said logic input signals constituting first signals in respect of said first converter circuit, said first converter circuit delivering from said first signals a first converted logic input signal whose analogue level is adapted to that of said second voltage value;

a second converter circuit for converting analogue levels of said logic control signals, said second converter circuit for converting comprising connected in succession in cascade with respect to said common reference voltage:

converter means supplied at said first voltage value and receiving on an input terminal a logic input signal consisting of said first signals and whose analogue level is adapted to that of said first voltage value, said first converter means delivering a replicated logic input signal and an inverted logic input signal, whose analogue level is adapted to that of said first voltage value, and differential converter means, supplied at said second voltage value and receiving said replicated logic input signal and said inverted logic signal, said differential converter means delivering a converted logic input signal in phase with said logic input signal and whose analogue level is adapted to that of said second voltage value, said converted logic input signal constituting said second logic signals, said logic control signals constituting second signals in respect of said second converter circuit, said second converter circuit delivering from said second signals, a second converted logic control signal whose analogue level is adapted to that of the second voltage value;

a third converted circuit for converting analogue levels of logic output signals, said third converted circuit for converting comprising connected in succession in cascade, with respect to said common reference voltage, an inverter stage supplied at said first voltage value, and receiving on an input terminal an input logic signal consisting of said first signals and whose analogue level is adapted to that of said first voltage value, said inverter stage delivering an inverted logic input signal and, cascade connected to said inverter stage, amplifier converter means supplied at said second voltage value receiving said inverted logic input signal on an input terminal and delivering, via amplification, a converted logic input signal in phase relationship with said logic input signal and whose analogue level is adapted to that of said second voltage value, said converted logic input signal constituting said second logic signals, wherein said amplifier converter means comprise:

a first inverter stage interconnected with said second voltage value by way of a feedback transistor, said first inverter stage receiving said logic input signal and delivering a replicated logic input signal at an analogue level substantially equal to that of said second voltage value;

a second inverter stage receiving on an input terminal said replicated logic input signal delivered by said first inverter stage;

a cumulative control transistor connected between said second voltage value and the input of said second inverter stage, the gate electrode of said cumulative control transistor being connected to the output of said inverter stage supplied with said first voltage value, said second inverter stage delivering on a second inverter stage output an inverted replicated logic input signal at an analogue level adapted to that of said second voltage value, said second inverter stage output being feedback-inter-connected with the gate electrode of said feedback transistor;

a third inverter stage receiving said inverted replicated logic input signal and delivering a calibrated replicated logic input signal;

a fourth inverter stage receiving said calibrated replicated logic input signal and delivering said converted logic input signal in phase relationship with the logic input signal and whose analogue level is adapted to that of said second voltage value, said logic output signals constituting third signals in respect of said third circuit for converting, said third converter circuit delivering, on the basis of these third signals, a converted logic output signal whose analogue level is adapted to that of said first voltage value.

6. In an integrated circuit of random access memory type comprising a first functional area consisting of a set of memory cells, and a second functional area consisting of buffer circuits, said memory cells being accessible by way of said buffer circuits, said first functional area being supplied from an electrical supply at a first voltage value and said second functional area being supplied from an electrical supply at a second voltage value, greater than or equal to said first voltage value, said first functional area delivering to said second functional area logic input signals and logic control signals at an analogue level adapted to said first voltage value and said second functional area delivering to said first functional area logic signals at an analogue level adapted to said second voltage value, a converter of analogue levels of said logic input signals, said logic control signals and of said logic output signals comprising at least, interconnected with respect to a same reference voltage:

a first converter circuit for converting analogue levels of the logic input signals, said first converter circuit for converting comprising connected in succession in cascade, with respect to said common reference voltage, an inverter stage supplied at said first voltage value, and receiving on an input terminal an input logic signal consisting of said first signals and whose analogue level is adapted to that of said first voltage value, said inverter stage delivering an inverted logic input signal and, cascade connected to said inverter stage, amplifier converter means supplied at said second voltage value receiving said inverted logic signal on an input terminal and delivering, via amplification, a converted logic input signal in phase relationship with said logic input signal and whose analogue level is adapted to that of said second voltage value, said converted logic input signal constituting said second logic signals, wherein said amplifier converter means comprise:

a first inverter stage interconnected with said second voltage value by way of a feedback transistor, said first inverter stage receiving said logic input signal and delivering a replicated logic input signal at an analogue level substantially equal to that of said second voltage value;

a second inverter stage receiving on an input terminal said replicated logic input signal delivered by said first inverter stage;

a cumulative control transistor connected between said second voltage value and the input of said second inverter stage, the gate electrode of said cumulative control transistor being connected to the output of said inverter stage supplied with said first voltage value, said second inverter stage delivering on a second inverter stage output an inverted replicated logic input signal at analogue level adapted to that of said second voltage value, said second inverter stage output being feedback-inter-connected with the gate electrode of said feedback transistor;

a third inverter stage receiving said inverted replicated logic input signal and delivering a calibrated replicated logic input signal;

a fourth inverter stage receiving said calibrated replicated logic input signal and delivering said converted logic input signal in phase relationship with the logic input signal and whose analogue level is adapted to that of said second voltage value, said logic input signals constituting first signals in respect of said first converter circuit for converting, said first converter circuit for converting delivering from said first signals a first converted logic input signal whose analogue level is adapted to that of said second voltage value;

a second converter circuit for converting analogue levels of said logic control signals, said second converter circuit for converting comprising connected in succession in cascade, with respect to said common reference voltage, an inverter stage supplied at said first voltage value, and receiving on an input terminal an input logic signal consisting of said first signals and whose analogue level is adapted to that of said first voltage value, said inverter stage delivering an inverted logic input signal and, cascade connected to said inverter stage, amplifier converter means supplied at said second voltage value receiving said inverted logic input signal on an input terminal and delivering, via amplification, a converted logic input signal in phase relationship with said logic input signal and whose analogue level is adapted to that of said second voltage value, said converted logic input signal constituting said second logic signals, wherein said amplifier converter means comprise:

a first inverter stage interconnected with said second voltage value by way of a feedback transistor, said first inverter stage receiving said logic input signal and delivering a replicated logic input signal at an analogue level substantially equal to that of said second voltage value;

a second inverter stage receiving on an input terminal said replicated logic input signal delivered by said first inverter stage;

a cumulative control transistor connected between said second voltage value and the input of said second inverter stage, the gate electrode of said cumulative control transistor being connected to the output of said inverter stage supplied with said first voltage value, said second inverter stage delivering on a second inverter stage output an inverted replicated logic input signal at an analogue level adapted to that of said second voltage value, said second inverter stage output being feedback-inter-connected with the gate electrode of said feedback transistor;

a third inverter stage receiving said inverted replicated logic input signal and delivering a calibrated replicated logic input signal;

a fourth inverter stage receiving said calibrated replicated logic input signal and delivering said converted logic input signal in phase relationship with the logic input signal and whose analogue level is adapted to that of said second voltage value, said logic control signals constituting second signals in respect of said second converter circuit for converting, said second converter circuit for converting delivering from said second signals a second converted logic control signal whose analogue level is adapted to that of said second voltage value;

a third converter circuit for converting analogue levels of said logic output signals, said third converter circuit for converting comprising connected in succession in cascade with respect to said common reference voltage:

converter means supplied at said first voltage value and receiving on an input terminal a logic input signal consisting of said first signals and whose analogue level is adapted to that of said first voltage value, said converter means delivering a replicated logic input signal and an inverted logic input signal, whose analogue level is adapted to that of said first voltage value, and differential converter means, supplied at said second voltage value and receiving said replicated logic input signal and said inverted logic signal, said differential converter means delivering a converted logic input signal in phase with said logic input signal and whose analogue level is adapted to that of said second voltage value, said converted logic input signal constituting said second logic signals, said logic output signals constituting third signals in respect of said third converter circuit for converting, said third converter circuit for converting delivering from said third signals a converter logic output signal whose analogue level is adapted to that of said first voltage value.

7. In an integrated circuit of random access memory type comprising a first functional area consisting of a set of memory cells and a second functional area formed by buffer circuits, said memory cells being accessible by way of said buffer circuits, said first functional area being supplied from an electrical supply which can be switched between a first and a second voltage value, said second voltage value being less than, equal to or greater than said first voltage value and said second functional area being supplied from an electrical supply which can be switched between said first and second voltage values, said first functional area delivering to said second functional area logic input signals and logic control signals at an analogue level adapted to said first and second voltage value respectively, and said second functional area delivering to said first functional area logic output signals at an analogue level adapted to said first and second voltage value respectively, a configurable converter for converting the analogue level of said logic input signals, said logic control signals and said logic output signals between the analogue levels of said first and second voltage value comprising at least, with respect to a same reference voltage:

a first and a second converter circuit for converting analogue levels of said logic signals, said first and second converter circuit for converting comprising connected in succession in cascade with respect to said common reference voltage:

converter means supplied at said first voltage value and receiving on an input terminal a logic input signal consisting of said first signals and whose analogue level is adapted to that of said first voltage value, said converter means delivering a replicated logic input signal and an inverted logic input signal, whose analogue level is adapted to that of said first voltage value, and differential converter means, supplied at said second voltage value and receiving said replicated logic input signal and said inverted logic signal, said second differential converter means delivering a converted logic input signal in phase with said logic input signal and whose analogue level is adapted to that of said second voltage value, said converted logic input signal constituting said second logic signals, said logic signals consisting of said logic input signals, said logic control signals and said logic output signals;

a third and a fourth converter circuit for converting analogue levels of said logic signals, said third and fourth converter circuit for converting comprising connected in succession in cascade, with respect to said common reference voltage, an inverter stage supplied at said first voltage value, and receiving on an input terminal an input logic signal consisting of said first signals and whose analogue level is adapted to that of said first voltage value, said inverter stage delivering an inverted logic input signal and, cascade connected to said inverter stage, amplifier converter means supplied at said second voltage value receiving said inverted logic input signal on an input terminal and delivering, via amplification, a converted logic input signal in phase relationship with said logic input signal and whose analogue level is adapted to that of said second voltage value, said converted logic input signal constituting said second logic signals, wherein said amplifier converter means comprise:

a first inverter stage interconnected with said second voltage value by way of a feedback transistor, said first inverter stage receiving said logic input signal and delivering a replicated logic input signal at an analogue level substantially equal to that of said second voltage value;

a second inverter stage receiving on an input terminal said replicated logic input signal delivered by said first inverter stage;

a cumulative control transistor connected between said second voltage value and the input of said second inverter stage, the gate electrode of said cumulative control transistor being connected to the output of said inverter stage supplied with said first voltage value, said second inverter stage delivering on a second inverter stage output an inverted replicated logic input signal at an analogue level adapted to that of said second voltage value, said second inverter stage output being feedback-inter-connected with the gate electrode of said feedback transistor;

a third inverter stage receiving said inverted replicated logic input signal and delivering a calibrated replicated logic input signal;

a fourth inverter stage receiving said calibrated replicated logic input signal and delivering said converted logic input signal in phase relationship with the logic input signal and whose analogue level is adapted to that of said second voltage value, said logic signals consisting of said logic input signals, said logic control signals and said logic output signals;

first and second switching means adapted to apply by coupling, either to said first and second circuits for converting, or to one of said third and fourth circuits for converting respectively logic input signals and logic control signals, respectively logic output signals in order to deliver a converted logic output signal whose analogue level is adapted to that of said first and second voltage value respectively, either to said third and second circuits for converting or to one of said first and second circuits for converting respectively logic input signals and logic control signals, respectively logic output signals in order to deliver a converted logic output signal whose analogue level is adapted to that of said second and first voltage value respectively;

means for managing said first and second switching means, upon a criteria of exclusion of simultaneous coupling of said first, second, third and fourth converter circuit for converting analogue levels and of coupling of three out of four circuits for converting so as to effect, either a high analogue level/low analogue level conversion and vice versa between first functional area and second functional area by coupling of said first, second and of one of said third fourth circuits for converting respectively, or a low analogue level/high analogue level conversion and vice versa between said first and second functional area by coupling of one of said first respectively second and of said third and fourth circuits for converting, or else a conversion between a same high respectively low analogue level as a function of the relative value of said first and of said second voltage value.

\* \* \* \* \*